United States Patent
Hellums

(10) Patent No.: US 7,777,569 B2
(45) Date of Patent: Aug. 17, 2010

(54) ANTI-POP METHOD AND APPARATUS FOR CLASS AB AMPLIFIERS

(75) Inventor: James R. Hellums, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 57 days.

(21) Appl. No.: 12/357,221

(22) Filed: Jan. 21, 2009

(65) Prior Publication Data

US 2010/0182087 A1 Jul. 22, 2010

(51) Int. Cl.
H03F 3/45 (2006.01)
(52) U.S. Cl. .......... 330/255; 330/253; 330/261
(58) Field of Classification Search .......... 330/253, 330/255, 257, 261
See application file for complete search history.

(56) References Cited

U.S. PATENT DOCUMENTS

| | | | |
|---|---|---|---|
| 5,436,588 A | 7/1995 | Ghaffaripour | |
| 5,491,437 A | 2/1996 | Rincon et al. | |
| 5,798,673 A | 8/1998 | Griffith et al. | |
| 5,963,093 A | 10/1999 | Corsi | |
| 6,292,057 B1 | 9/2001 | Corsi et al. | |
| 6,326,847 B1 * | 12/2001 | Xu | 330/253 |
| 6,798,285 B2 | 9/2004 | Candy | |
| 6,801,087 B2 * | 10/2004 | Ausserlechner | 330/255 |
| 7,030,699 B2 | 4/2006 | Richard et al. | |
| 7,088,182 B2 | 8/2006 | Ivanov | |
| 7,227,413 B1 | 6/2007 | Marty | |
| 7,382,187 B2 | 6/2008 | Aisu | |
| 2003/0067350 A1 | 4/2003 | Goutti et al. | |

FOREIGN PATENT DOCUMENTS

EP 0862265 A2 2/1998

* cited by examiner

*Primary Examiner*—Khanh V Nguyen
(74) *Attorney, Agent, or Firm*—John J. Patti; Wade J. Brady, III; Frederick J. Telecky, Jr.

(57) ABSTRACT

A method for actuating an amplifier to generally eliminate a pop is provided. Accordingly, a plurality of current sources is actuated in an input stage, and a plurality of bias voltages are applied to the input stage. After a predetermined period after the step of applying a plurality of bias voltages to the input stage and the step of actuating a plurality of current sources in an input stage, a control circuit is actuated, and a transistor within a control amplifier stage is turned on at a predetermined rate.

18 Claims, 4 Drawing Sheets

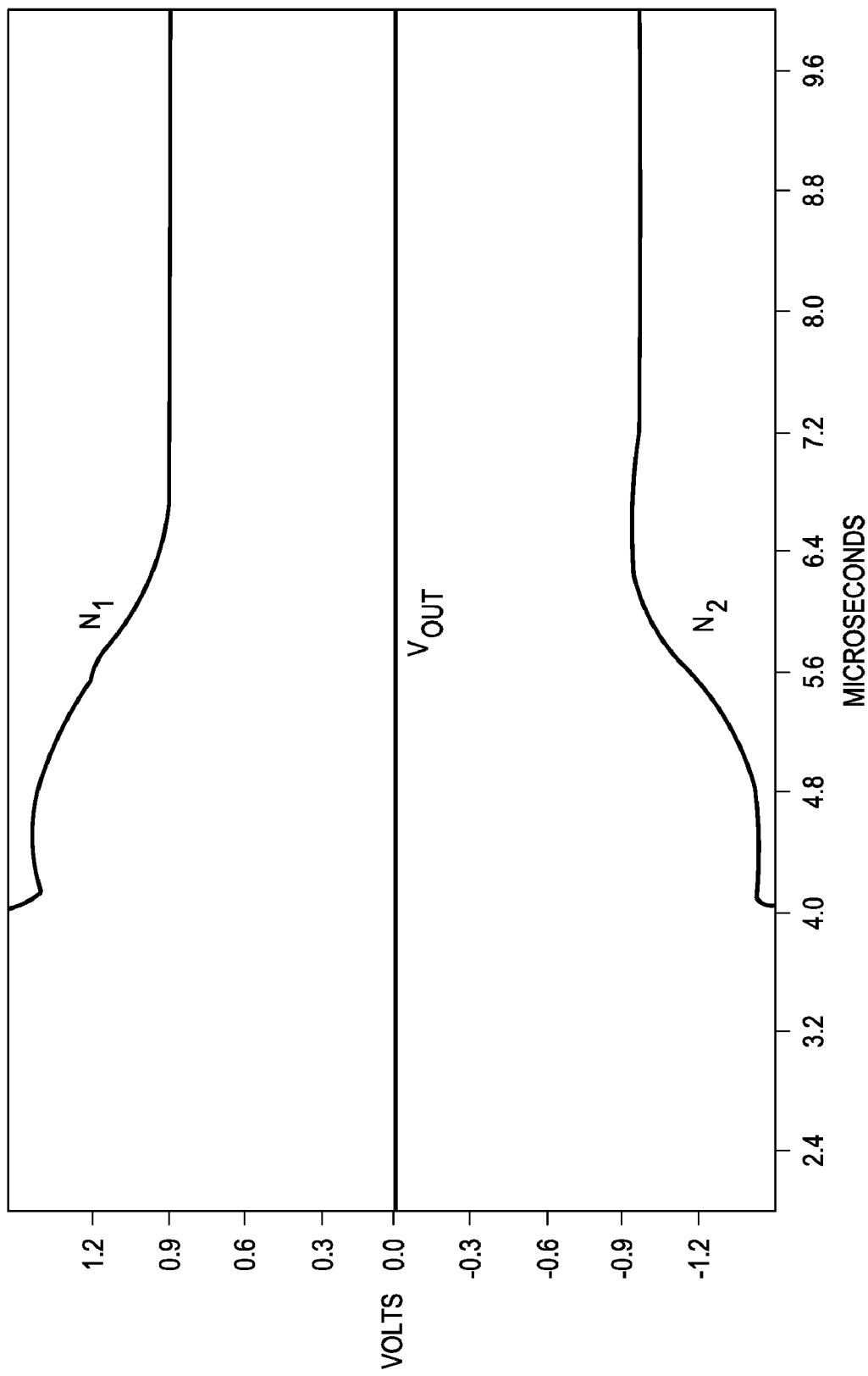

ANTI-POP METHOD AND APPARATUS FOR CLASS AB AMPLIFIERS

TECHNICAL FIELD

The invention relates generally to a class AB amplifier and, more particularly, to anti-pop or anti-click circuitry for class AB amplifiers.

BACKGROUND

Amplifiers are employed in many applications. In particular, operational amplifiers are often utilized to amplify voltages. These operational amplifiers, though, may have oscillations in the output gate voltages, and, as can be seen in FIG. 1, these oscillations result in a pop or click. Over the years, however, several designs have been developed to combat pop or click. Some examples of these circuits are U.S. Patent Pre-Grant Pub. No. 2003/0067350; European Patent No. 0862265; and U.S. Pat. Nos. 5,436,588; 5,491,437; 5,798,673; 5,963,093; 6,292,057; 6,798,285; 7,030,699; 7,227,413; 7,088,182; and 7,382,187.

SUMMARY

An embodiment of the invention, accordingly, provides an apparatus. The apparatus comprises an input stage having biasing circuitry that is coupled to a first intermediate node and a second intermediate node, wherein the input stage is adapted to receive at least one input signal, and wherein at least a portion of the input stage is actuated by a first control signal; a control amplifier stage, wherein at least a portion of the control amplifier stage is actuated by a second signal; a control circuit that is coupled to the control amplifier stage, the bias circuitry, at least one of the first and second intermediate nodes, wherein at least a portion of the control circuit is actuated by the second control signal; and an output stage that is coupled to the first and second intermediate nodes, wherein the output stage is adapted to provide at least one output signal. The control amplifier stage includes a current source; a transistor that is coupled between the first and second intermediate nodes; and a capacitor that is coupled to the control electrode of the transistor, wherein the capacitor is charged by the current source to provide a linear ramp for voltage on the capacitor, and wherein the slope of the linear ramp allows the transistor to be turned on at a predetermined rate.

In accordance with an embodiment of the invention, the control circuit further comprises a second transistor coupled between the first intermediate node and a first rail, wherein the second transistor is actuated by the second control signal; and a third transistor coupled between the second intermediate node and a second voltage rail, wherein the third transistor is actuated by an inverse of the second control signal.

In accordance with an embodiment of the invention, the apparatus further comprises a second control amplifier stage, wherein at least a portion of the second control amplifier stage is actuated by an inverse of the second signal, and wherein the second control amplifier stage includes: a second current source; a second transistor that is coupled between the first and second intermediate nodes; and a second capacitor that is coupled to the control electrode of the second transistor, wherein the second capacitor is charged by the second current source to provide a second linear ramp for voltage on the second capacitor, and wherein the slope of the second linear ramp allows the second transistor to be turned on at a second predetermined rate.

In accordance with an embodiment of the invention, the control circuit further comprises a third current source that is coupled to the control amplifier stage; a third transistor coupled to the third current source and to the control amplifier stage; a fourth current source that is coupled to the second control amplifier stage; and a fourth transistor coupled to the fourth current source and to the second control amplifier stage.

In accordance with an embodiment of the invention, the control circuit further comprises a second transistor coupled to the bias circuitry and a first voltage rail, wherein the second transistor is actuated by the second control signal; and a third transistor coupled to the bias circuitry and a second voltage rail, wherein the third transistor is actuated by an inverse of the second control signal.

In accordance with an embodiment of the invention, the transistor is an FET.

In accordance with an embodiment of the invention, the bias circuitry further comprises a second current source; a first FET coupled at its source to the second current source, wherein the first FET receives a first bias voltage at its gate; a second FET coupled at its drain to the drain of the first FET, wherein the second FET receives a second bias voltage at its gate; a third FET coupled at its drain to the source of the second FET and coupled at its gate to the drain of the first transistor; a third current source; a fourth FET coupled at its source to the third current source and coupled to the first intermediate node at its drain, wherein the fourth FET receives a third bias voltage at its gate; a fifth FET coupled at its drain to the second intermediate node, wherein the fifth FET receives a fourth bias voltage at its gate; and a sixth FET coupled at its drain to the source of the fifth FET and coupled at its gate to the gate of the third FET.

In accordance with an embodiment of the invention, an apparatus is provided. The apparatus comprises an input stage having biasing circuitry that is coupled to a first intermediate node and a second intermediate node, wherein the input stage is adapted to receive at least one input signal, and wherein at least a portion of the input stage is actuated by a first control signal; a control amplifier, wherein at least a portion of the control amplifier stage is actuated by a second signal; a control circuit that is coupled to the control amplifier stage, the bias circuitry, at least one of the first and second intermediate nodes, wherein at least a portion of the control circuit is actuated by the second control signal; an output stage that is coupled to the first and second intermediate nodes, wherein the output stage is adapted to provide at least one output signal; and a digital controller that is coupled to the input stage, wherein the digital controller enables the second control signal to actuate at least a portion of the control amplifier stage when a bias point in the input stage has settled. The control amplifier stage includes a current source; a transistor that is coupled between the first and second intermediate nodes; and a capacitor that is coupled to the control electrode of the transistor, wherein the capacitor is charged by the current source to provide a linear ramp for voltage on the capacitor, and wherein the slope of the linear ramp allow the transistor to be turned on at a predetermined rate.

In accordance with an embodiment of the invention, the digital controller further comprises a comparator that is coupled to an internal node from the bias circuit and that compares the voltage at the internal node to a reference voltage; and a timer that is coupled to the comparator, wherein the timer enables the second control signal to actuate at least a portion of the control circuit after a predetermined period.

In accordance with an embodiment of the invention, the digital controller further comprises a timer that is coupled to an internal node of the bias circuitry, wherein the timer enables the second control signal to actuate at least a portion of the control circuit after a predetermined period.

In accordance with an embodiment of the invention, a method for actuating an amplifier to generally eliminate a pop is provided. The method comprises actuating a plurality of current sources in an input stage; applying a plurality of bias voltages to the input stage; waiting for a predetermined period after applying a plurality of bias voltages to the input stage and the step of actuating a plurality of current sources in the input stage so that a bias point for the input stage has settled; actuating a control circuit after the predetermined period has lapsed; and turning on a transistor within a control amplifier stage at a predetermined rate.

In accordance with an embodiment of the invention, the method further comprises the step of comparing a voltage of an internal node from the input stage to a reference voltage.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 5 is a graph depicting the gate voltages of the output stage and the output voltage of the amplifier of FIGS. 2-4.

DETAILED DESCRIPTION

Figure 1:
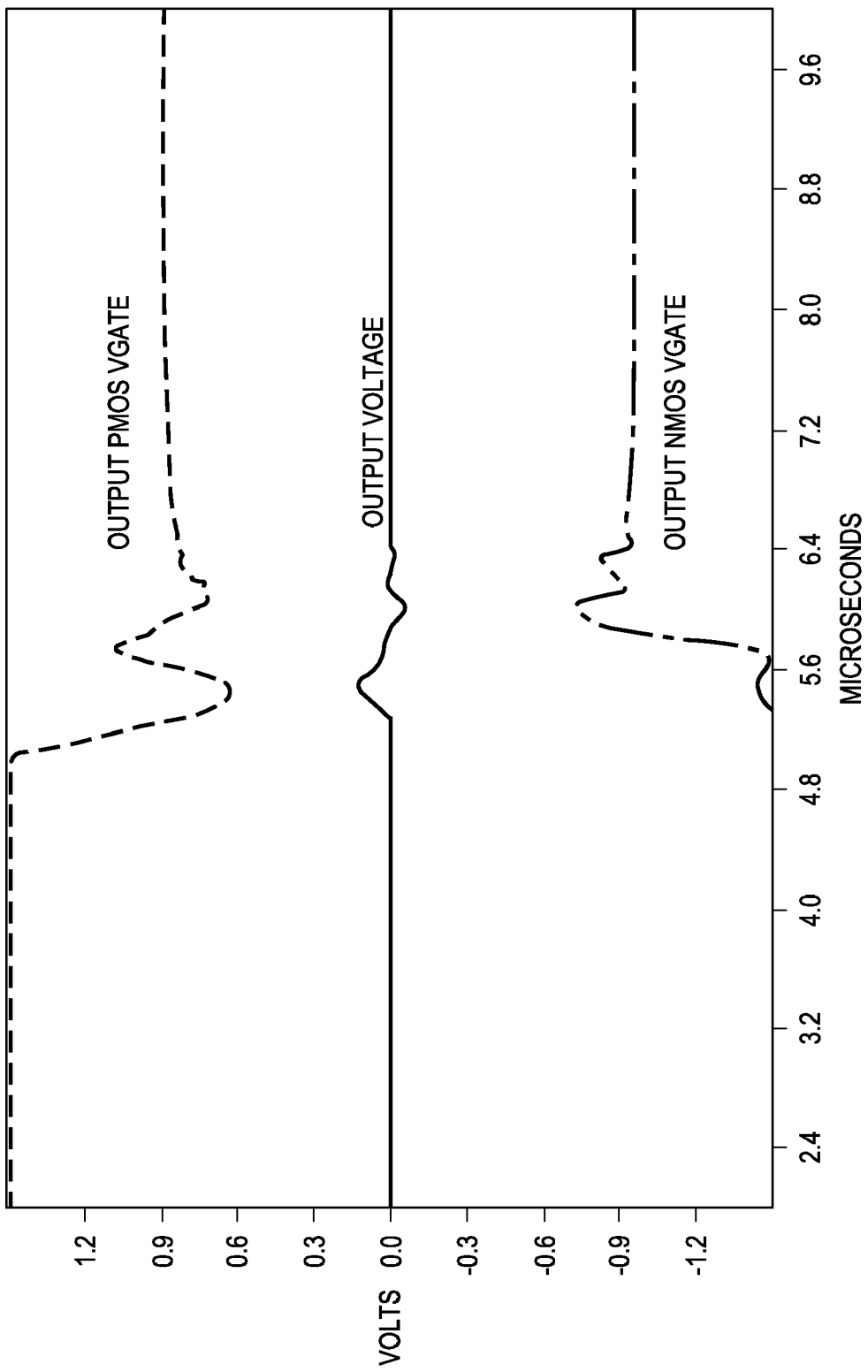
FIG. 1 is a graph depicting a pop or click with conventional operational amplifiers.

Refer now to the drawings wherein depicted elements are, for the sake of clarity, not necessarily shown to scale and wherein like or similar elements are designated by the same reference numeral through the several views.

Figure 2:
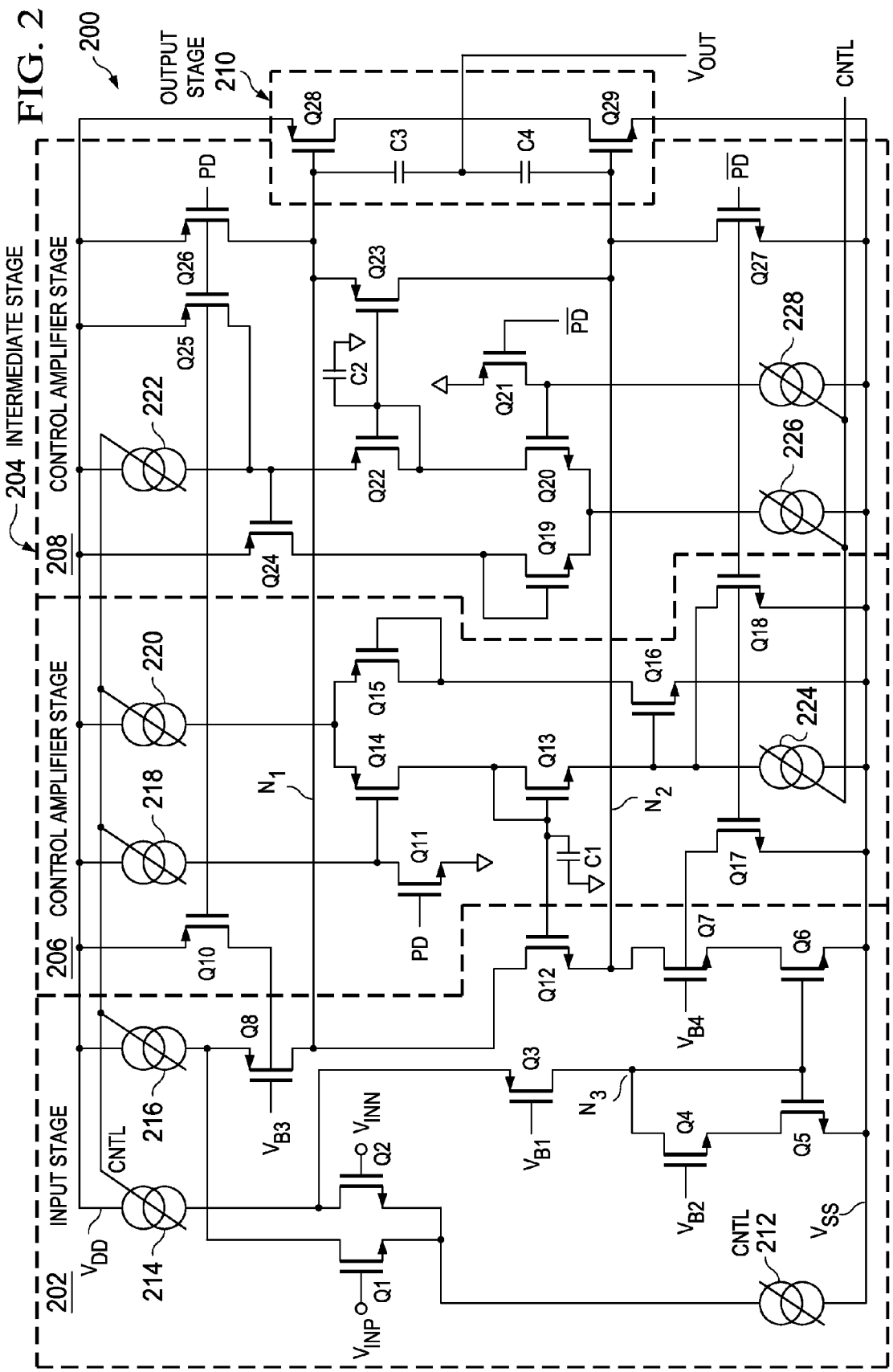
FIG. 2 is an amplifier in accordance with an embodiment of the invention.

Referring to FIG. 2 of the drawings, the reference numeral 200 generally designates an amplifier in accordance with an embodiment of the invention. Amplifier 200 is generally considered to be a class AB amplifier, which is commonly employed in audio applications. Amplifier 200 is also generally comprised of three sections or stages: input stage 202, intermediate stage 204, and output stage 210.

The first stage is the input stage 202. The input stage 202 is generally a folded cascode arrangement that receives input signals $V_{INN}$ and $V_{INP}$ through two inputs. These inputs are preferably the control electrodes (or gates in an arrangement employing FETs) of transistors $Q_1$ and $Q_2$ (which are preferably NMOS FETs). Transistors $Q_1$ and $Q_2$ are generally coupled to one another and to a current source 212 (at their sources in an arrangement employing FETs). The current source 212 is also generally coupled to negative voltage rail $V_{SS}$. Each of transistors $Q_1$ and $Q_2$ is also generally coupled to a bias circuit (at their drains in an arrangement employing FETs).

The bias circuit generally has two branches and operates to provide bias voltages. The first branch of the bias circuit is generally comprised of a current source 214 (which is coupled to positive voltage rail $V_{DD}$) and transistors $Q_3$, $Q_4$, and $Q_5$, and the first branch receives bias voltages $V_{b1}$ and $V_{b2}$. The second branch is generally comprised of current source 216 (which is coupled to positive voltage rail $V_{DD}$) and transistors $Q_6$, $Q_7$, and $Q_8$, and the second branch receives bias voltages $V_{b3}$ and $V_{b4}$.

In operation, transistor $Q_2$ is able to provide a signal to the first branch of the bias circuit. Preferably, transistor $Q_2$ is coupled (at its drain in an arrangement employing FETs) to a node between current source 214 and transistor $Q_3$. Transistor $Q_3$ (which is preferably a PMOS FET) is coupled to current source 214 (at its source in an arrangement employing FETs) while receiving a bias voltage $V_{b1}$ at its control electrode (gate in an arrangement employing FETs). Transistor $Q_4$ (which is preferably an NMOS FET) receives a bias voltage $V_{b2}$ at its control electrode (gate in an arrangement employing FETs) and is coupled (at its drain in an arrangement employing FETs) to transistor $Q_3$ (at its source in an arrangement employing FETs). Additionally, transistor $Q_5$ (which is preferably an NMOS FET) is coupled between transistor $Q_4$ and negative voltage rail $V_{SS}$ with its control electrode (gate in an arrangement employing FETs) coupled to the node between transistors $Q_3$ and $Q_4$.

With respect to transistor $Q_1$, it is able to provide a signal to the second branch of the bias circuit. Preferably, transistor $Q_1$ is coupled (at its drain in an arrangement employing FETs) to a node between current source 216 and transistor $Q_8$. Transistor $Q_8$ (which is preferably a PMOS FET) is coupled to current source 216 (at its source in an arrangement employing FETs) while receiving a bias voltage $V_{b3}$ at its control electrode (gate in an arrangement employing FETs). Additionally, transistor $Q_8$ (which is preferably a PMOS FET) is coupled to intermediate node $N_1$ (at its drain in an arrangement employing FETs). Transistor $Q_7$ (which is preferably an NMOS FET) receives a bias voltage $V_{b4}$ at its control electrode (gate in an arrangement employing FETs) and is coupled (at its drain in an arrangement employing FETs) to intermediate node $N_2$. Additionally, transistor $Q_6$ (which is preferably an NMOS FET) is coupled between transistor $Q_7$ and negative voltage rail $V_{SS}$ with it control electrode (gate in an arrangement employing FETs) coupled to the control electrode of transistor $Q_5$.

Coupled to the input stage 202 is the intermediate stage 204. The intermediate stage 204 is generally comprised of control amplifier stages 206 and 208 and a control circuit. Preferably, it is the interaction between that input stage 202 and the intermediate stage 204 that can be modified to reduce pop or click. Generally, the current sources 212, 214, and 216 are switchable current sources that are generally actuated by a first control signal CNTL. On start-up, these current sources 212, 214, and 216 are actuated; then, once a bias point in the input stage 202 has settled, a second control signal $\overline{PD}$ (and its inverse PD) can actuate the control circuit to turn on the intermediate stage 204 in a controlled manner or at a predetermined rate.

Control amplifier stage 206 is generally comprised of current sources 220 and 224, transistors $Q_{12}$ through $Q_{16}$, and capacitor $C_1$. Current source 220 is coupled between the positive voltage rail $V_{DD}$ and transistors $Q_{14}$ and $Q_{15}$ (which are preferably PMOS FETs) and can be actuated by the first control signal CNTL. Transistors $Q_{14}$ and $Q_{15}$ are coupled to one another in a differential pair arrangement (with their sources coupled together in an arrangement employing FETs). Preferably, transistor $Q_{14}$ is coupled to the control circuit at its control electrode (gate in an arrangement employing FETs), and transistor $Q_{15}$ is preferably diode-connected. Diode-connected transistor $Q_{13}$ (which is preferably an NMOS FET) is also coupled between transistor $Q_{14}$ and current source 224 (which can be actuated by the first control signal CNTL). Transistor $Q_{12}$ (which is preferably an NMOS FET) is coupled between intermediate nodes $N_1$ and $N_2$ and is coupled at its control electrode (gate in an arrangement employing FETs) to the control electrode of transistor $Q_{13}$ and capacitor $C_1$. Transistor $Q_{16}$ (which is preferably an NMOS FET) is coupled between transistor $Q_{15}$ and negative voltage rail $V_{SS}$ with its control electrode coupled to the node between the transistor $Q_{13}$ and current source 224.

Control amplifier stage 208 is generally comprised of current sources 222 and 226, transistors $Q_{19}$, $Q_{20}$, $Q_{22}$ $Q_{23}$, and $Q_{24}$, and capacitor $C_2$. Current source 226 is coupled between the negative voltage rail $V_{SS}$ and transistors $Q_{19}$ and $Q_{20}$ (which are preferably NMOS FETs) and can be actuated by the first control signal CNTL. Transistors $Q_{19}$ and $Q_{20}$ are coupled to one another in a differential pair arrangement (with their sources coupled together in an arrangement employing FETs). Preferably, transistor $Q_{20}$ is coupled to the control circuit at its control electrode (gate in an arrangement employing FETs), and transistor $Q_{19}$ is preferably diode-connected. Diode-connected transistor $Q_{22}$ (which is preferably a PMOS FET) is also coupled between transistor $Q_{20}$ and current source 222 (which can be actuated by the first control signal CNTL). Transistor $Q_{23}$ (which is preferably a PMOS FET) is coupled between intermediate nodes $N_1$ and $N_2$ and is coupled at its control electrode (gate in an arrangement employing FETs) to the control electrode of transistor $Q_{22}$ and capacitor $C_2$. Transistor $Q_{24}$ (which is preferably a PMOS FET) is coupled between transistor $Q_{19}$ and positive voltage rail $V_{DD}$ with its control electrode coupled to the node between the transistor $Q_{22}$ and current source 222.

As stated above, the control circuit generally operates to assist in the "turn on" of the amplifier 200. The control circuit is generally comprised of transistors $Q_{10}$, $Q_{11}$, $Q_{26}$, $Q_{25}$, $Q_{21}$, $Q_{17}$, $Q_{18}$, and $Q_{27}$ and current sources 218 and 228. Once a bias point in the input stage 202 has settled, the second control signal $\overline{PD}$ transitions from logic high to logic low, and its inverse PD transitions from logic low to logic high. With these transitions, transistors $Q_{17}$ (preferably a NMOS FET) and $Q_{10}$ (preferably a PMOS FET) are actuated, allowing the control electrodes (gates in an arrangement employing FETs) of transistors $Q_8$ and $Q_7$ to "bias up" to bias voltages $V_{b3}$ and $V_{b4}$, respectively. Preferably, bias voltages $V_{b3}$ and $V_{b4}$ are approximately the same as bias voltages $V_{b1}$ and $V_{b2}$, respectively. Additionally, the transitions of the second control signal $\overline{PD}$ and its inverse PD actuate transistors $Q_{21}$ (preferably a PMOS FET) and transistors $Q_{11}$ (preferably an NMOS FET), which grounds the control electrodes of transistor $Q_{14}$ and $Q_{20}$ or sets the control electrode voltage at an analog midpoint between the positive voltage rail $V_{DD}$ and the negative voltage rail $V_{SS}$. Thus, with the control electrodes of transistor $Q_{14}$ and $Q_{20}$ beginning at ground, current sources 220 and 226 are able to charge capacitors $C_1$ and $C_2$, respectively. The current sources 220 and 226 provide a linear ramp for the voltage on the capacitors $C_1$ and $C_2$ so that transistors $Q_{12}$ and $Q_{23}$ can be turned on in a controlled manner or at a predetermined rate. Once the capacitors $C_1$ and $C_2$ are charged, the current sources 220 and 226 can charge the control electrodes (gates in an arrangement employing FETs) of transistors $Q_{16}$ and $Q_{24}$ to allow the stages 206 and 208 to find their respective bias points. Once the stages 206 and 208 find their respective closed loop bias points, the gains of the stages 206 and 208 allow intermediate nodes $N_1$ and $N_2$ to be controlled through transistors $Q_{12}$ and $Q_{23}$ so as to provide smooth S-like curves for intermediate nodes $N_1$ and $N_2$ as shown in FIG. 5.

Coupled to the intermediate stage 204 is the output stage 210. The output stage 210 is adapted to provide an output $V_{OUT}$ to external devices, such as speakers, and the output stage 210 is generally comprised of capacitors $C_3$ and $C_4$ and transistors $Q_{28}$ and $Q_{29}$. The transistors $Q_{28}$ and $Q_{29}$ are generally arranged in a push-pull arrangement with an output node between them to provide the output voltage or signal $V_{OUT}$, where transistor $Q_{28}$ is preferably a PMOS FET and transistor $Q_{29}$ is preferably an NMOS FET. Additionally, transistor $Q_{28}$ is coupled at its control electrode (gate in an arrangement employing FETs) to intermediate node $N_1$, and transistor $Q_{29}$ is coupled at its control electrode (gate in an arrangement employing FETs) to intermediate node $N_2$. Moreover, coupled between each of the intermediate nodes $N_1$ and $N_2$ and the output node are capacitors $C_3$ and $C_4$.

Figure 3:
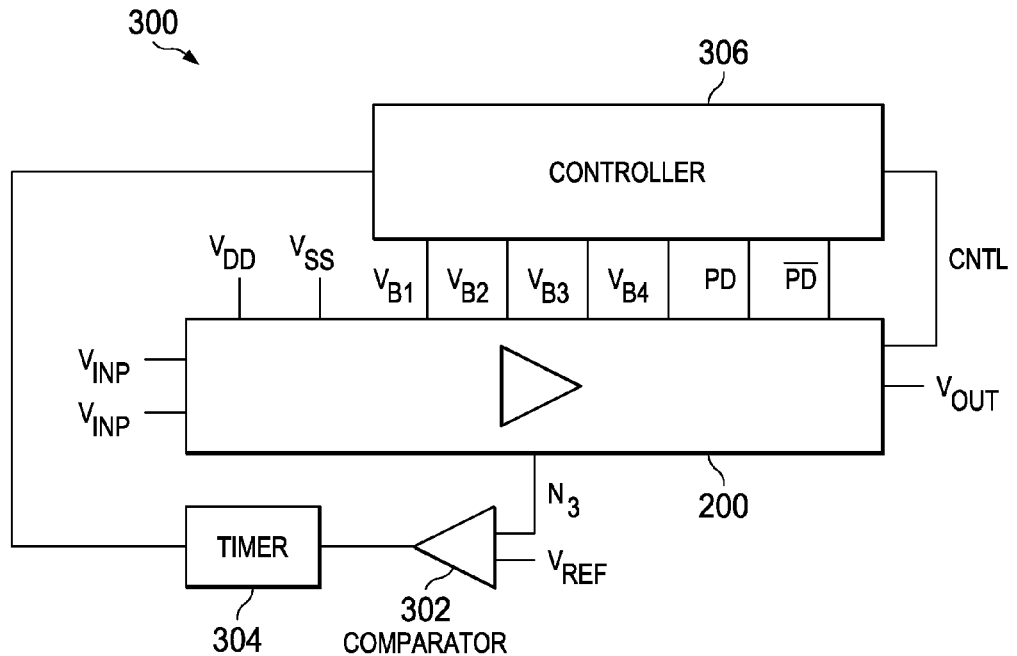
FIG. 3 is a digital controller and amplifier in accordance with an embodiment of the invention.
Figure 4:
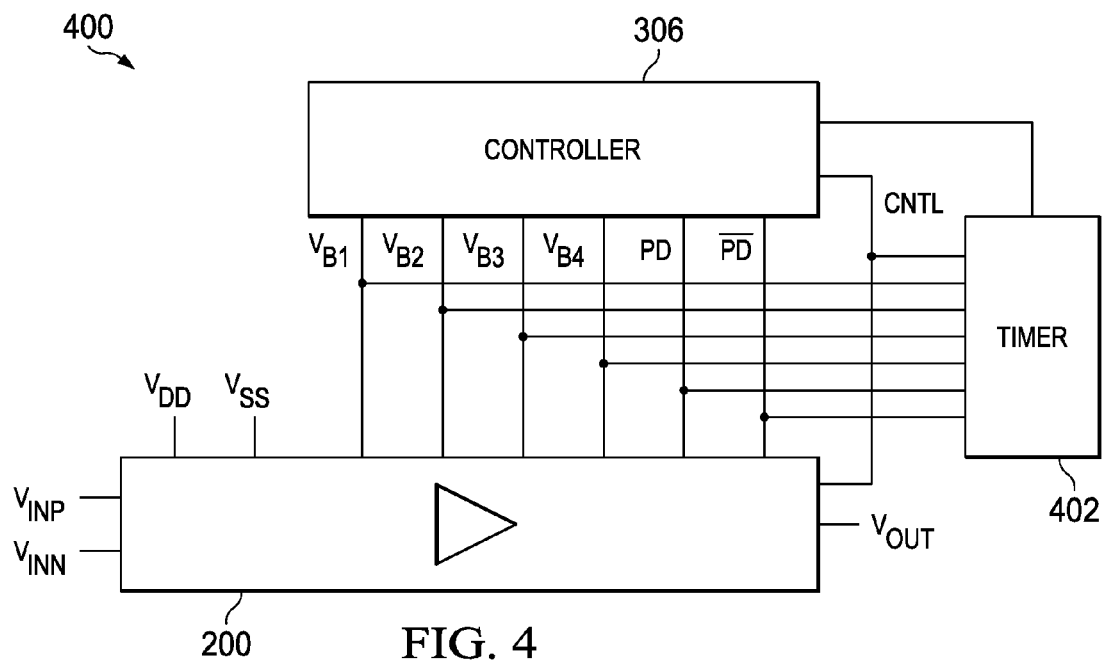
FIG. 4 is another digital controller and amplifier in accordance with an embodiment of the invention.

In addition to the internal circuitry of the amplifier 200, manipulation of the control signals also assists in reducing pop or click. Turning to FIGS. 3 and 4, amplifier 200 is operated or controlled in two different control schemes, which are shown. For circuits 300 and 400, controller 306 is adapted to provide the bias voltages $V_{b1}$ through $V_{b4}$, first control signal CNTL, second control signal $\overline{PD}$ (and its inverse PD) to the amplifier 200. In each of the schemes, a delay is imposed to generally ensure that the bias point of the input stage 202 of amplifier 200 has settled. In circuit 300, a comparator 302 is used to monitor an internal node $N_3$ of the input stage 202 by comparing the voltage at node $N_3$ to a reference voltage $V_{REF}$. Once the voltage at node $N_3$ has reached its desired threshold value, the timer 304 delays startup of the intermediate stage 204 to account for variances. Circuit 400, on the other hand, employs a timer 402 that delays for a predetermined period or time after startup based on the statistics of the amplifier 200 (generally the two times the longest 3 sigma time) after the input stages 202 is actuated. Thus, these two schemes contribute to the smooth S-like curves for intermediate nodes $N_1$ and $N_2$ as shown in FIG. 5.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
    an input stage having biasing circuitry that is coupled to a first intermediate node and a second intermediate node, wherein the input stage is adapted to receive at least one input signal, and wherein at least a portion of the input stage is actuated by a first control signal;
    a control amplifier stage, wherein at least a portion of the control amplifier stage is actuated by a second signal, and wherein the control amplifier stage includes:
        a current source;

a transistor that is coupled between the first and second intermediate nodes; and a capacitor that is coupled to the control electrode of the transistor, wherein the capacitor is charged by the current source to provide a linear ramp for voltage on the capacitor, and wherein the slope of the linear ramp allow the transistor to be turned on at a predetermined rate;

a control circuit that is coupled to the control amplifier stage, the bias circuitry, at least one of the first and second intermediate nodes, wherein at least a portion of the control circuit is actuated by the second control signal; and an output stage that is coupled to the first and second intermediate nodes, wherein the output stage is adapted to provide at least one output signal.

2. The apparatus of claim 1, wherein the control circuit further comprises:

a second transistor coupled between the first intermediate node and a first rail, wherein the second transistor is actuated by the second control signal; and a third transistor coupled between the second intermediate node and a second voltage rail, wherein the third transistor is actuated by an inverse of the second control signal.

3. The apparatus of claim 1, wherein the apparatus further comprises a second control amplifier stage, wherein at least a portion of the second control amplifier stage is actuated by an inverse of the second signal, and wherein the second control amplifier stage includes:

a second current source;

a second transistor that is coupled between the first and second intermediate nodes; and a second capacitor that is coupled to the control electrode of the second transistor, wherein the second capacitor is charged by the second current source to provide a second linear ramp for voltage on the second capacitor, and wherein the slope of the second linear ramp allow the second transistor to be turned on at a second predetermined rate.

4. The apparatus of claim 3, wherein the control circuit further comprises:

a third current source that is coupled to the control amplifier stage;

a third transistor coupled to the third current source and to the control amplifier stage;

a fourth current source that is coupled to the second control amplifier stage; and a fourth transistor coupled to the fourth current source and to the second control amplifier stage.

5. The apparatus of claim 1, wherein the control circuit further comprises:

a second transistor coupled to the bias circuitry and a first voltage rail, wherein the second transistor is actuated by the second control signal; and a third transistor coupled to the bias circuitry and a second voltage rail, wherein the third transistor is actuated by an inverse of the second control signal.

6. The apparatus of claim 1, wherein the transistor is a FET.

7. The apparatus of claim 1, wherein the bias circuitry further comprises:

a second current source;

a first FET coupled at its source to the second current source, wherein the first FET receives a first bias voltage at its gate;

a second FET coupled at its drain to the drain of the first FET, wherein the second FET receives a second bias voltage at its gate;

a third FET coupled at its drain to the source of the second FET and coupled at its gate to the drain of the first transistor;

a third current source;

a fourth FET coupled at its source to the third current source and coupled to the first intermediate node at its drain, wherein the fourth FET receives a third bias voltage at its gate;

a fifth FET coupled at its drain to the second intermediate node, wherein the fifth FET receives a fourth bias voltage at its gate; and a sixth FET coupled at its drain to the source of the fifth FET and coupled at its gate to the gate of the third FET.

8. An apparatus comprising:

an input stage having biasing circuitry that is coupled to a first intermediate node and a second intermediate node, wherein the input stage is adapted to receive at least one input signal, and wherein at least a portion of the input stage is actuated by a first control signal;

a control amplifier, wherein at least a portion of the control amplifier stage is actuated by a second signal, and wherein the control amplifier stage includes:

a current source;

a transistor that is coupled between the first and second intermediate nodes; and a capacitor that is coupled to the control electrode of the transistor, wherein the capacitor is charged by the current source to provide a linear ramp for voltage on the capacitor, and wherein the slope of the linear ramp allow the transistor to be turned on at a predetermined rate;

a control circuit that is coupled to the control amplifier stage, the bias circuitry, at least one of the first and second intermediate nodes, wherein at least a portion of the control circuit is actuated by the second control signal;

an output stage that is coupled to the first and second intermediate nodes, wherein the output stage is adapted to provide at least one output signal; and a digital controller that is coupled to the input stage, wherein the digital controller enables the second control signal to actuate at least a portion of the control amplifier stage when a bias point in the input stage has settled.

9. The apparatus of claim 8, wherein the control circuit further comprises:

a second transistor coupled between the first intermediate node and a first rail, wherein the second transistor is actuated by the second control signal; and a third transistor coupled between the second intermediate node and a second voltage rail, wherein the third transistor is actuated by an inverse of the second control signal.

10. The apparatus of claim 8, wherein the apparatus further comprises a second control amplifier stage, wherein at least a portion of the second control amplifier stage is actuated by an inverse of the second signal, and wherein the second control amplifier stage includes:

a second current source;

a second transistor that is coupled between the first and second intermediate nodes; and a second capacitor that is coupled to the control electrode of the second transistor, wherein the second capacitor is charged by the second current source to provide a second linear ramp for voltage on the second capacitor, and wherein the slope of the second linear ramp allows the second transistor to be turned on at a second predetermined rate.

11. The apparatus of claim 10, wherein the control circuit further comprises:
   a third current source that is coupled to the control amplifier stage;
   a third transistor coupled to the third current source and to the control amplifier stage;
   a fourth current source that is coupled to the second control amplifier stage; and
   a fourth transistor coupled to the fourth current source and to the second control amplifier stage.

12. The apparatus of claim 8, wherein the control circuit further comprises:
   a second transistor coupled to the bias circuitry and a first voltage rail, wherein the second transistor is actuated by the second control signal; and
   a third transistor coupled to the bias circuitry and a second voltage rail, wherein the third transistor is actuated by an inverse of the second control signal.

13. The apparatus of claim 8, wherein the transistor is a FET.

14. The apparatus of claim 8, wherein the bias circuitry further comprises:
   a second current source;
   a first FET coupled at its source to the second current source, wherein the first FET receives a first bias voltage at its gate;
   a second FET coupled at its drain to the drain of the first FET, wherein the second FET receives a second bias voltage at its gate;
   a third FET coupled at its drain to the source of the second FET and coupled at its gate to the drain of the first transistor;
   a third current source;
   a fourth FET coupled at its source to the third current source and coupled to the first intermediate node at its drain, wherein the fourth FET receives a third bias voltage at its gate;
   a fifth FET coupled at its drain to the second intermediate node, wherein the fifth FET receives a fourth bias voltage at its gate; and
   a sixth FET coupled at its drain to the source of the fifth FET and coupled at its gate to the gate of the third FET.

15. The apparatus of claim 8, wherein the digital controller further comprises:
   a comparator that is coupled to an internal node from the bias circuit and that compares the voltage at the internal node to a reference voltage; and
   a timer that is coupled to the comparator, wherein the timer enables the second control signal to actuate at least a portion of the control circuit after a predetermined period.

16. The apparatus of claim 8, wherein the digital controller further comprises a timer that is coupled to an internal node of the bias circuitry, wherein the timer enables the second control signal to actuate at least a portion of the control circuit after a predetermined period.

17. A method for actuating an amplifier to generally eliminate a pop, the method comprising:
   actuating a plurality of current sources in an input stage;
   applying a plurality of bias voltages to the input stage;
   waiting for a predetermined period after the applying a plurality of bias voltages to the input stage and the step of actuating a plurality of current sources in the input stage so that a bias point for the input stage has settled;
   actuating a control circuit after the predetermined period has lapsed; and
   turning on a transistor within a control amplifier stage at a predetermined rate.

18. The method of claim 17, wherein the method further comprises the step of comparing a voltage of an internal node from the input stage to a reference voltage.

* * * * *